United States Patent [19]

Hareyama

[11] 4,251,743
[45] Feb. 17, 1981

[54] CURRENT SOURCE CIRCUIT
[75] Inventor: Kyuichi Hareyama, Tokyo, Japan
[73] Assignee: Nippon Electric Co., Ltd., Tokyo, Japan
[21] Appl. No.: 955,742
[22] Filed: Oct. 30, 1978
[30] Foreign Application Priority Data Oct. 28, 1977 [JP] Japan .................................. 52/129922

[51] Int. Cl.³ ............................................. H03K 3/01
[52] U.S. Cl. .................................. 307/297; 307/229;
307/254; 307/296 R; 340/347 AD
[58] Field of Search ............... 307/296, 297, 251, 268;
340/347 NT, 229, 254

[56] References Cited
U.S. PATENT DOCUMENTS

| | | | |
|---|---|---|---|
| 3,316,547 | 4/1967 | Ammann | 340/347 AD |
| 4,064,448 | 12/1977 | Eatock | 307/297 |
| 4,142,113 | 2/1979 | Lundberg | 307/297 |

Primary Examiner—Stanley D. Miller, Jr.
Assistant Examiner—B. P. Davis
Attorney, Agent, or Firm—Sughrue, Rothwell, Mion, Zinn and Macpeak

[57] ABSTRACT

A current source circuit particularly adapted for use with an analog-to-digital converter having automatic scale adjustment. A first current source produces a fixed reference current of a first value in accordance with the scale adjustment while a second current source produces a second current of which the value is controlled by the output of a differential amplifier coupled to the control input of the second current source. A detector circuit is provided for determining the difference between the second current value and the reference value. The detected difference value is fed back to a control input of the amplifier to make the second current value equal to the reference value by reducing the difference.

20 Claims, 8 Drawing Figures

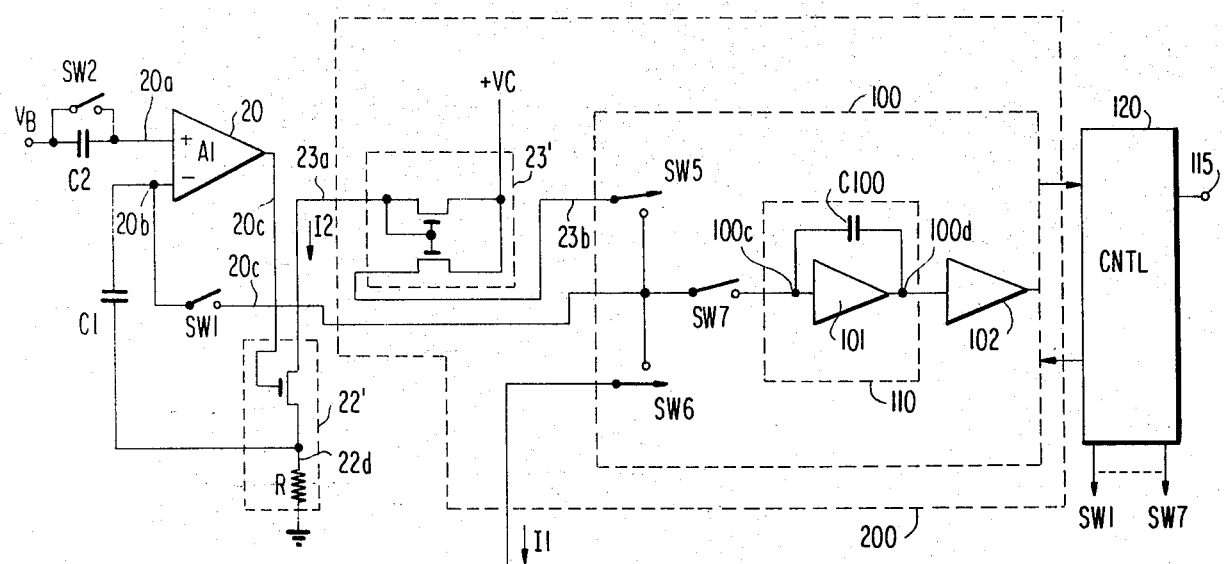
FIG. 7
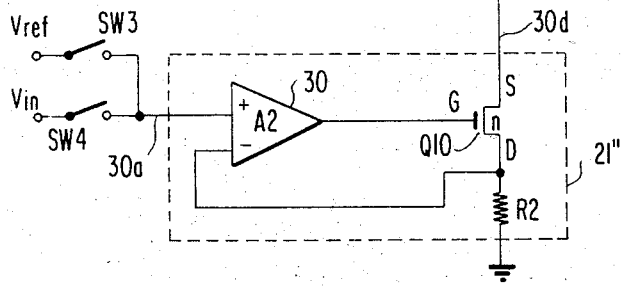
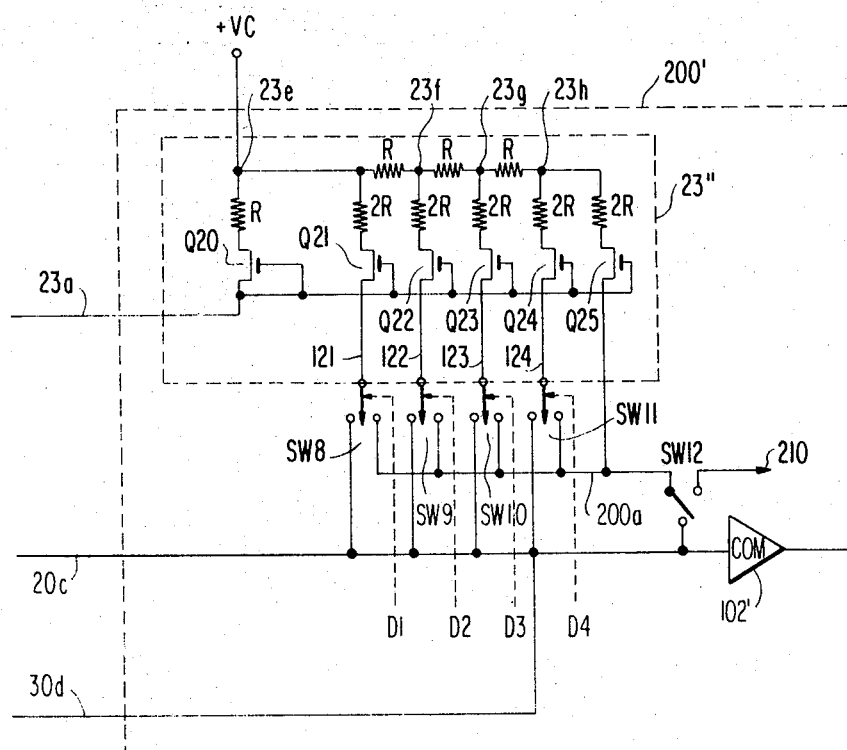
FIG. 8

CURRENT SOURCE CIRCUIT

BACKGROUND OF THE INVENTION

The invention relates to a current source circuit and, more particularly, to a current source circuit adaptable for use with an analog-to-digital converter.

One known analog-to-digital (hereinafter referred to as A-D) converters such as that disclosed in U.S. Pat. No. 3,316,547 compares an analog input current with a reference current through an integration circuit. Another type converter compares an analog input current with combinations of a plurality of weighted reference currents. In such an A-D converter, the reference current is obtained by converting to a current a voltage applied from an exterior stable reference voltage source. Particularly in the latter case, the reference voltage, or the reference divided voltage, is adjusted at the initial stage to set up a reference current value for the purpose of scale adjusting.

An A-D converter of the integration type will be described with reference to FIG. 1. An integrator 10 is comprised of an operational amplifier 3 and an integration capacitor Co connected between the output terminal and one of the input terminals of the operational amplifiers 3. A reference current source 1 feeds a reference current $I_{ref}$ to the integrator 10 through a contact a of a switch So when the switch So is turned to the contact a. A second source 2 feeds an unknown current Ix corresponding to an unknown voltage Vx to the integrator 10 through a contact b of the switch So when the switch is turned to the contact b. In current source, an unknown voltage Vxo is converted into the unknown current Ix and in current source 1 the reference voltage $V_{ref}$ is converted into the reference current $I_{ref}$. In this type converter, the unknown current Ix is integrated by the integrator 10 from an initial value over a given period of time. Then, over the following period, the reference current $I_{ref}$ is inversely integrated until the integration value reaches the initial value. In this manner, the current Ix is made to correspond to the "following period" and the result of the integration is displayed digitally. This type of A-D conversion is discussed fully in the above-mentioned U.S. patent, and therefore no further explanation need be given here. Before the conversion operation, the reference current $I_{ref}$ is adjusted by adjusting the reference voltage $V_{ref}$. In this case, the reference current $I_{ref}$ is generally made to correspond to the full scale of the converter, i.e. the maximum expected value of current Ix (max). Such a scale adjustment is effected during device set-up. However, drift may occur in the scale adjustment over a relatively long period of time because it is affected by its ambient temperature change and the change of the components' characteristics for example, due to the aging. The error in the scale adjustment is due primarily to two factors, an error due to the variation of the external reference voltage value $V_{ref}$ per se and an error due to the characteristic variation of the A-D converter per se. The latter error is generally called a gain error. Particularly in C-MOS monolithic A-D converters, the gain error is relatively large. This has necessitated the development of a circuit for automatically correcting the gain error. The gain error arises from the fact, for example, that the potential at the input terminal of the amplifier 3 in FIG. 1 changes in the course of the use of the converter so that offset value appears between the terminal c and the terminal d which varies. When the voltage or current from a temperature sensor using a thermistor or the like is subjected to an A-D conversion, what is detected is the ratio between the input and output voltages of the sensor and, therefore, in its application, the voltage applied to the sensor is essentially used as the reference voltage. For this, the variation of the reference voltage does not cause scale error. In this case, only the gain error causes the scale error. Thus automatic correction of the gain error has been required.

SUMMARY OF THE INVENTION

Accordingly, an object of the invention is to provide a current source circuit which is well adapted to a monolithic type integrated circuit and is capable of automatically adjusting its current to a given value.

Another object of the invention is to provide a current circuit which is capable of an automatic scale adjustment when it is used as a reference current source in an analog-to-digital converter.

Still another object of the invention is to provide an analog-to-digital converter free from scale error.

A current source circuit according to the present invention comprises a first current source capable of producing a given value of current, an amplifier means, a second current source in which a current value is controlled by the output of the amplifier means, and a means for detecting a difference between the current value in the second current source and the given current value fed from first current control means and in which the detected output from the detecting means is fed to the input of the amplifier means for controlling the output of the amplifier means so as to make the current in the second current source equal to the given current value by reducing the difference. According to the invention, there is provided a constant current source comprising a differential amplifier having a noninverting input biased at a given potential and an inverting input, a first field effect transistor (FET) which is coupled at its gate to the output terminal of the amplifier, at the drain or other of the source to a first power source through a resistor, and at the source or drain to a current terminal, the different current detecting means including a second FET of which one of the source or drain is coupled to a second power source and with the gate coupled the other of the drain or source and also the current terminal, and a third FET of which one of the source or drain is coupled to the second power source and with the gate coupled to the gate of the second FET, the current source being connected at one end to the drain or source of the third FET and at the other end to the first power source in which the connection point between one of the drain or source of the third FET and the one end of the first current source is connected through a switch to the inverting input terminal of the amplifier, and with a capacitor connected at one end thereof to one of the drain or source of the first FET and at the other end to the inverting input terminal of the amplifier. In this circuit, if there is a difference between the current through the resistor and the current via the current source, the different current flows at the connection point and charges the capacitor. In this way, the given current value is obtained. According to another aspect of the invention, there is also provided a constant current source comprising a first current source as a reference, a differential amplifier operating as an amplifying component, a circuit connection for connecting the non-inverting input terminal of the differential amplifier to a fixed bias potential, a second current source driven by the output of the differential amplifier, a negative feedback path including a capacitor and connected between the second current source and the inverting input terminal of the differential amplifier through the capacitor, a circuit for detecting a difference between the currents of the first and second current sources, and a switch for selectively coupling the difference current to the inverting input terminal of the differential amplifier. Wherein, during a first period of time the switch is closed, the difference current charges the capacitor until the difference current becomes zero so that the current value in the first current source becomes equal to that in the second current source. During a second period of time after the first period of time the switch is opened and the equality between the current in the first current source and that in the second current source is sustained.

In another aspect of the invention, in the constant current circuit described above, the circuit connecting the non-inverting input terminal of the differential amplifier to the fixed bias potential may comprise a second capacitor which is connected at one terminal to the non-inverting input terminal and at the other terminal to the fixed bias potential and a switch connected across the second capacitor.

The current source circuit thus constructed can automatically compensate for a deviated current value to obtain a given value. If the constant current source is used as a reference current source in an A-D converter, the scale adjustment of the converter can be automatically carried out.

Other objects, features and advantages of the invention will be apparent from the following description taken in connection with the accompanying drawings, in which:

BRIEF DESCRIPTION OF THE DRAWINGS

FIG. 7 shows a circuit diagram of an A-D converter employing the constant current source of the invention; and FIG. 8 partly shows a circuit diagram of another A-D converter employing the constant current source of the invention.

DETAILED DESCRIPTION OF THE PREFERRED EMBODIMENTS

Figure 1:
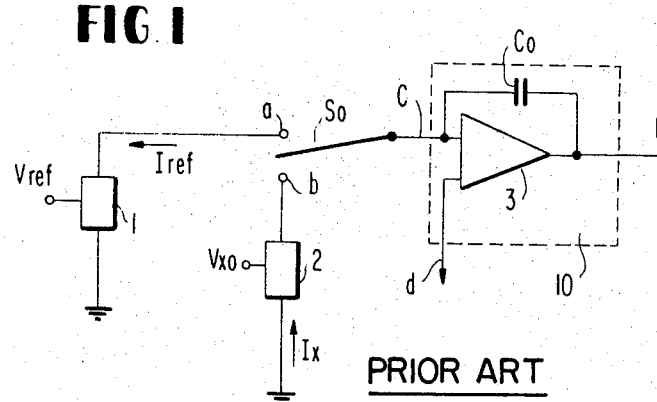
FIG. 1 is a circuit diagram showing an integrating type A-D converter of the prior art.
Figure 2:
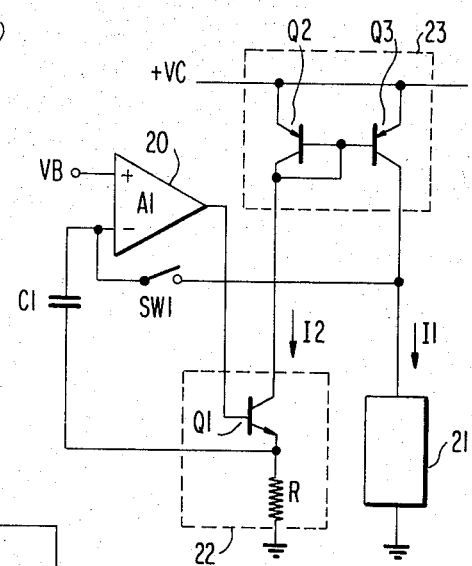
FIG. 2 shows a circuit diagram of a first embodiment of a constant current source according to the invention.

Reference is first made to FIG. 2 illustrating an embodiment of a constant current source circuit according to the invention. As shown, a differential amplifier 20 is connected at the non-inverting input terminal(+) thereof to a given potential $V_B$, at the output terminal to the base of an NPN transistor Q1 and at the inverting input terminal(−) to one end of a capacitor C1 and one end of a switch SW1 such as an analog switch. The transistor Q1 is connected at the collector to the collector of a PNP transistor Q2 and the emitter to one end of a resistor R and the other end of the capacitor C1. The resistor R is grounded at the other end. The transistor Q1 and the resistor R cooperate to form a current source 22 (referred to as a second current source).

Another current source 21 (referred to as a first current source) is connected at one end to ground and at the other end to the collector of a PNP transistor Q3 and one end of a switch SW1.

The emitters of the transistors Q2 and Q3 are connected to a power source +Vc while the base and collector of the transistor Q2 are coupled together and to the base of the transistor Q3. Transistors Q2 and Q3 thus connected form a difference current detection circuit 23 for detecting a difference between a first current $I_1$ flowing through the first current source 21 and a second current $I_2$ flowing through the second current source 22. The switch SW1 is connected at the other end to the inverting input terminal(−) of the differential amplifier 20. The capacitor C1 is connected at one end to the inverting input terminal(−) and the other end of the switch SW1 and the other end to the emitter of the transistor Q2 and to the resistor R. The capacitor C1 feeds back the current $I_2$ to the inverting input terminal of the amplifier 20. The switch SW1 selectively feeds back the current $I_1$ to the same terminal.

A voltage appearing across the emitter resistor R of the transistor Q1 is converted into the corresponding current $I_2$ which flows from the collector of the same transistor Q2. The difference current detection circuit 23 detects a difference between the current $I_2$ and the reference current $I_1$ fed from the first current source 21. The detected difference current, when the switch SW1 is turned on, charges the capacitor C1 and the charging voltage across the capacitor C1 controls the transistor Q1 through the amplifier 20. The charging by the difference current lasts until the difference current becomes zero through the feed-back operation. When the difference current reaches zero, the circuit is in a balanced state. The transistor Q2, which provides a current path for the second current $I_2$, controls with its connection the transistor Q3 which provides a current path for the reference current $I_1$ so that a difference current between the currents $I_1$ and $I_2$ is fed from the collector of the transistor Q3 through the switch SW1 to the inverting input terminal of the amplifier 20.

More particularly, assume now that a difference current at time $t_o$ produced by an error voltage $-\Delta Vin$ across the resistor R at time $t_o$ is designated by $I_o(t_o)$. The difference current $I_o$ is given by $I_o(t_o) = -\Delta Vin/R$. A difference current $I_o(t_1)$ at a time $t_1$ after the switch SW1 is closed is expressed $$I_o(t_1) = -\Delta Vin/R - \frac{1}{CR} \int_{t_o}^{t_1} I_o(t)\, dt$$

hence, $$I_o(t_1) = \frac{\Delta Vin}{R} \cdot e^{-\frac{t_1}{RC}}$$

where C is the capacitance of the capacitor C1. The residual error voltage component $V_E$ across the capacitor C1 at time $t_1$ is $$V_E = -\Delta V_{in}\, e^{-t1/RC}$$

Figure 3:
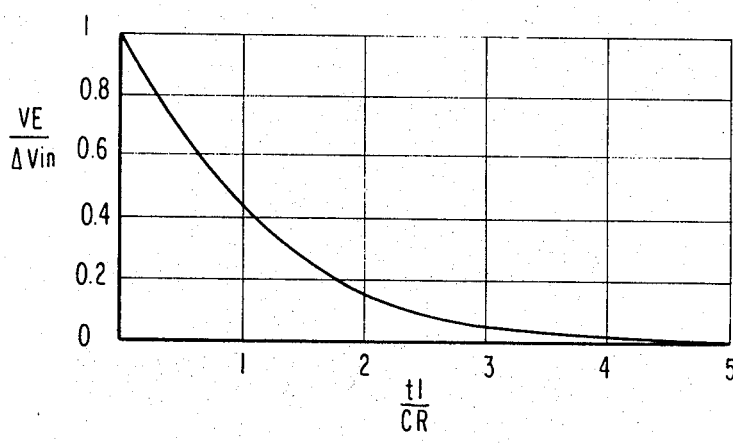
FIG. 3 is a graph showing a response characteristic of the constant current source shown in FIG. 2.

The residual error voltage component $V_E$ damps with time, and its variation or the response characteristic is shown in FIG. 3.

Let us consider a case where, under a condition that $V_B=10$ V and $\Delta V_{in}=100$ mV, the second current $I_2$ is automatically corrected to be within an error of 0.01%. This condition implies $$\frac{V_E}{\Delta V_{in}} \cdot \frac{\Delta V_{in}}{V_B} < 0.01\%$$

i.e., $$\frac{V_E}{\Delta V_{in}} < 1\%.$$

Assuming that $R=50$ K$\omega$ and $C=0.02$ $\mu$F, then a value of $CR=1\times 10^{-3}$ sec$=1$ ms is obtained. As seen from FIG. 3, the automatic correction is completed after about 5 ms after time $t_o$. When the switch SW1 is opened after 5 ms, the equality between the first and the second currents $I_1$ and $I_2$ is sustained.

The switch SW1 is preferably constructed with a MOS FET or Junction FET. In such a switch element, switching is carried out by applying a control voltage to the gate terminal thereof. However the FET element inherently has a parasitic capacitance between the channel region and the gate. Because of this, the amplitude ($\Delta V_s$) of the control voltage at its switching causes charge to transfer through the parasitic capacitor (Cg) to the capacitor C1. This generates an error voltage $\Delta V_e$ which is expressed as $\Delta V_e = C_g/C \times V_s$. For example, in case of $C_g=2$ pF, $C=0.02$ $\mu$F and $\Delta V_s=10$ V, $\Delta V_e$ is 1 mV.

Figure 4:
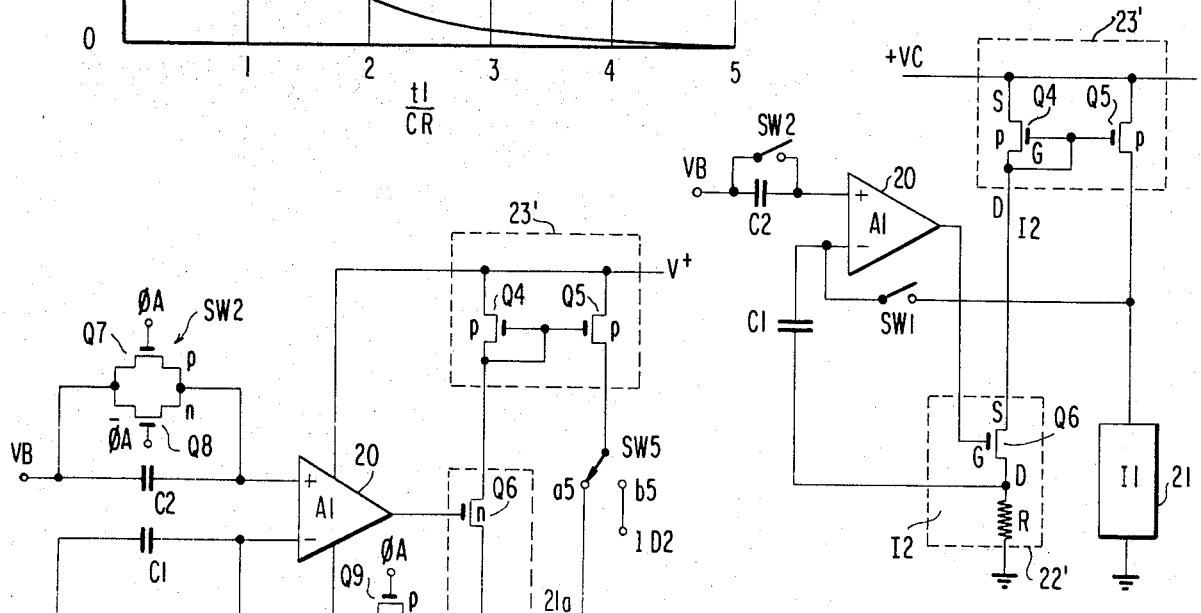
FIG. 4 shows a circuit diagram of a second embodiment of the constant current source according to the invention.

Turning now to FIG. 4, there is shown a second embodiment of the constant current source according to the invention.

As shown, the non-inverting input terminal(+) of the operational amplifier 20 is connected through a second capacitor C2 to a fixed bias potential $V_B$. A second switch SW2 is connected across the second capacitor C2 for selectively shunting from the second capacitor C2 path. The second current source 22' is composed of n-channel FET Q6 and a resistor R. The difference current detection circuit 23' is composed of p-channel FETs Q4 and Q5, forming a current inverting circuit. The first current source 21 is arranged between ground and the drain of FET Q5. The circuitry operates in such a way that, when both the switches SW1 and SW2 are closed, the automatic correcting operation is performed during a first time period. After this operation, when those switches are opened, during a second period of time, the equality between the first and second currents is sustained.

The effects resulting from the use of the second switch SW2 and the second capacitor C2 are described below. In this description, assumed that FET elements are used for the switches. Error voltage $\Delta V_{e1}$ and $\Delta V_{e2}$ resulting from the transfer charges respectively flowing into the capacitors C1 and C2 due to the switches SW1 and SW2 when those switches are switched, are given by $$\Delta V_{e1} = \frac{C_{g1}}{C1}\Delta V_s, \quad \Delta V_{e2} = \frac{C_{g2}}{C2}\Delta V_s$$

where $\Delta V_s$ is the amplitude of a control voltage commonly used for the switches SW1 and SW2 and $C_{g1}$ and $C_{g2}$ are channel-gate capacitance of the respective switches SW1 and SW2. In case of $C1=C2$ and $C_{g1}=C_{g2}$, $\Delta V_{e1}$ equals to $\Delta V_{e2}$. Therefore, error voltages due to the transfer charges at the switching operation ideally nullified by complementarily canceling one another. Accordingly, an output voltage which is unaffected by the error voltages appears at the output of the amplifier 20.

When the FET elements and the capacitors manufactured using monolithic integrated circuit technology, they can be produced within a relative accuracy on the order of 0.1% with present-day techniques. These may be advantageously employed with the second embodiment of the invention described above. Because the relative accuracy is approximately 0.1%, the second embodiment with $C1=C2=20$ pF$=0.02$ $\mu$F/1000 can attain much the same effect as that by the first embodiment with the component condition that $R=50$ K$\omega$ and $C=0.02$ $\mu$F so that the error voltage due to the transfer charge may be minimized. Further, the automatic correcting operation is rapidly completed. Since the time constant CR is 1 $\mu$S, the automatic correcting operation is complete after approximately 5 $\mu$S after $t_o$.

Figure 5:
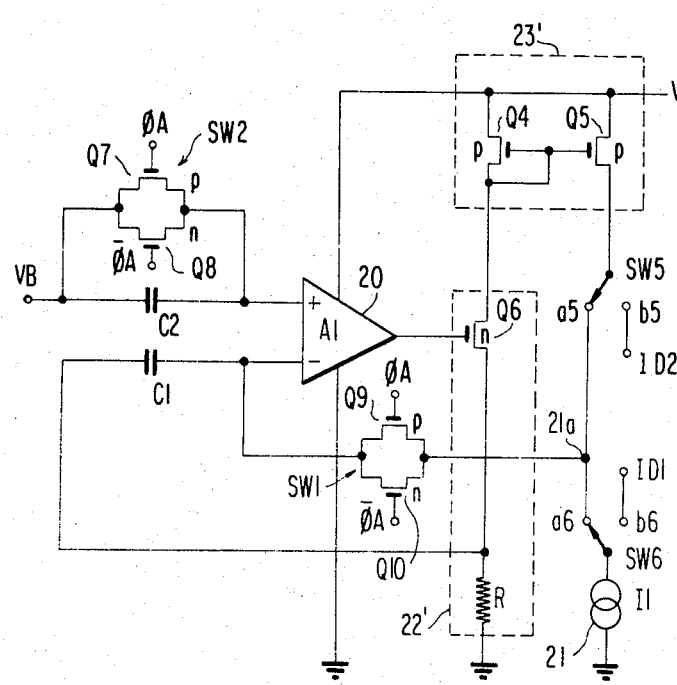
FIG. 5 illustrates in more detail the circuit construction of the constant current source shown in FIG. 4.

Further details of the second embodiment mentioned above will be given with reference to FIG. 5. In FIG. 5, complementary type metal-oxide-semiconductor field effect transistors (CMOS FET) are used for the first and second switches SW1 and SW2. The circuitry of FIG. 5 may entirely be made monolithic by using the CMOS integrated circuit technology. As shown, the first switch SW1 is composed of a p-channel FET Q9 and an n-channel FET Q10 of which the sources and drains are coupled in parallel to each other. A control signal $\phi A$ is applied to the gate of the FET Q9. A signal $\overline{\phi A}$, which is the inverted signal $\phi A$, is applied to the gate of the FET Q10. Turn-on of these FETs Q9 and Q10 is thus simultaneously controlled as well as turn-off. The second switch SW2 also is composed of a p-channel FET Q7 and an n-channel FET Q8 similarly connected in parallel. The signal $\phi A$ is applied to the gate of the FET Q7 and the signal $\overline{\phi A}$ is applied to the gate of the FET Q8. The switches SW1 and SW2 are synchronously switched. Current take-out switches SW5 and SW6 are provided between the first current source 21 and the difference current detection circuit 23'. Those switches are used to conduct the currents to an exterior circuit after the currents of the first and second current sources are balanced. When the switch SW5 is turned to the contact b5, current equal to the current value $I_2$ in the second current source 22' is conducted through terminal ID2 to the exterior circuit. When the switch SW6 is turned to the contact b6, the current equal to the current $I_1$ of the first current source 21 is taken out through a terminal ID1. After the current $I_2$ is corrected, the first current source 21 is used as a current source capable of feeding any value of current and thus the current $I_1$ can assume a proper value as required.

This example uses the CMOS FET elements for the switch SW1, as mentioned above. Accordingly, it can quite substantially reduce the transfer charge occurring when the switch is turned off.

Figure 6:
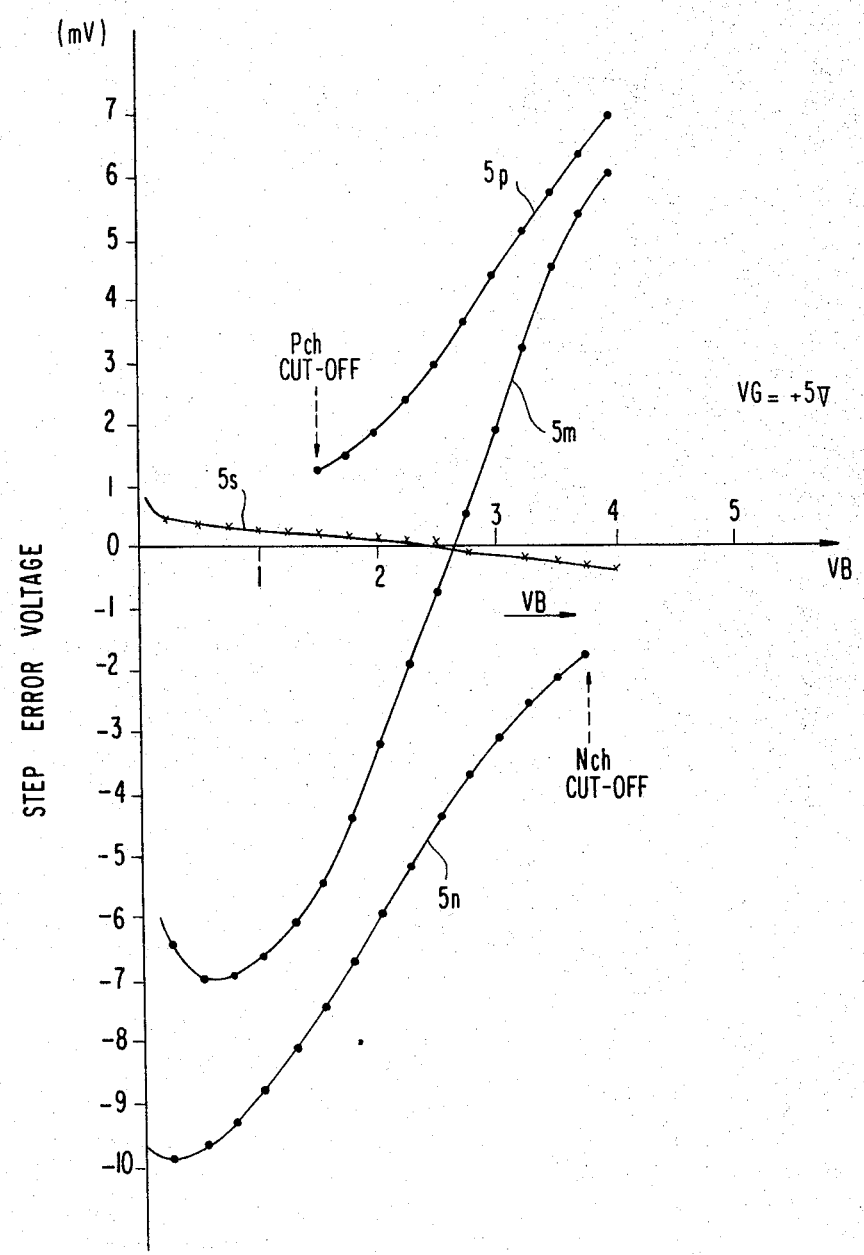
FIG. 6 is a graph showing a variation of a step error voltage with respect to a source voltage $V_B$ when FETs used in the constant current circuit are turned off.

The charge transfer will be described in detail with reference to FIG. 6. In the figure, curves 5P and 5N respectively illustrate variations of the step error voltages due to the charge transfer with respect to the source voltage $V_B$ when the p- and n-channel MOS FETs are used for the switch SW1 and the gate voltage is +5 V. As seen from the curves, the p-channel MOS FET switch is characterized by a positive step error while the n-channel MOS FET switch is characterized by a negative step error. A curve 5 m is plotted showing the same relation when a parallel combination of the n- and p-channel MOS FETs is used for each switch in FIG. 4. The curve 5 m shows that the step error is positive when the source voltage is relatively high while it is negative in a low source-voltage region. A curve 5s plotted shows a variation of the step error voltage in the version of the offset value between two input terminals of the amplifier (A1) 20 when the two switches SW1 and SW2 are simultaneously operated. As shown, the step error voltage, and thus its effect, is substantially reduced over a relatively wide range of the source voltage. The reason for this may be seen as follows. At the time that the switch is transferred from an ON state to an OFF state, that is to say, the first period for the automatic correction shifts to the second period for the equal current, the p- and n-channel MOS FETs are both changed from the ON state to the OFF state. At this time, residual holes and electrons of the p- and n-channel FETs recombine completely or partly, and uncombined ones flow into the capacitor. It is for this reason that the amount of the transfer charge for the capacitors C1 and C2 is reduced and thus the error voltage also is reduced.

In actual experiment depicted by a curve 5s, with the amplitude of the FET control signal approximately O to $V_G$ and in any case, and under $V_B \approx \frac{1}{2} \cdot V_G$, the residual holes and electrons almost recombine with the result that charge transfer to the capacitors is very small and the step error voltage is almost zero. Also in the vicinity of $V_B \neq \frac{1}{2} \cdot V_G$ the step error characteristic is quite excellent as indicated by the curve 5s. As indicated by the curve 5s, when the switches SW1 and SW2 are simultaneously operated and $V_G = 5V$, the step error voltage falls within ±0.5 m V in the range of the source voltage 0.25 V < $V_B$ < 4 V.

Turning now to FIG. 7, there is shown an example of an A-D converter using the constant current source circuit of the invention. As shown, the first current source 21″ is composed of a differential amplifier (A2) 30, an n-channel FET Q10 and a resistor R2. The amplifier 30 is connected at its non-inverting input terminal 30a to a reference voltage source Vref through a switch SW3 and to an unknown voltage source Vin to be measured through a switch SW4. These voltages are selectively applied to the terminal 30a under control of a control unit (CNTL) 120. The gate of the FET Q10 is connected to the output terminal of the amplifier 30, the drain is connected to the inverting input terminal (−) of the amplifier 30 thereby forming a feed-back path and to one end of the resistor R2, which is grounded at its other end, and the source is connected to the movable contact of the switch SW6. The output terminal 30d, which is the source of the FET Q10 of the first current source 21″ is coupled to a terminal 23b of the difference current detection circuit 23′, through switches SW5 and SW6 which are also under control of the control unit 120. The circuitry including the difference current detection circuit 23′, the second current source 22′ and the differential amplifier (A1) 20 is the same as the corresponding part of FIG. 4. Therefore, the explanation of it will be omitted. An integration/comparator circuit 100 is composed of an integrator 110, a comparator 102 and switches SW5, SW6 and SW7. The integrator 110 includes an operational amplifier 101 and an integrating capacitor C100 connected between the input terminal 100C of the amplifier 101 and the output connecting to the comparator 102. The input terminal 100C of the amplifier 101 is connected to one end of the switch SW7 which is connected at its other end to one end 20C of the switch SW1 and the fixed contact of the switches SW5 and SW6. The control unit 120 controls the integration/comparator circuit 100 and the switches SW1 to SW7, and performs a digital operation so as to produce an output signal on an output terminal 115.

In operation, during the first period of the automatic scale adjustment, the switches SW1, SW2, SW3, SW5 and SW6 are closed and the switch SW7 is open. The circuit formed at this time is similar that in FIG. 4. At this stage, a reference voltage Vref serving as a reference for the correction is applied to the first current source 21″ so that the $I_1$ at this time assumes a value proportional to the reference value Vref, that is $I_1 = K$ Vref (K is a constant). In this case, the current $I_1$ is so selected as to be the maximum value measurable by the A-D converter, i.e. the full scale value and the reference voltage Vref is preferably selected to be a value corresponding to that current $I_1$. The current $I_1$ thus produced by current source 21″ passes through the difference current detection circuit 23′ and the capacitor C1 with the circuit operating so that the current $I_2$ is made equal to the current $I_1$, as described with reference to FIG. 2. In this manner, the current $I_2$ is produced as a reference current in the integrating operation. Then the A-D conversion is then performed during a second period of time. In the description to follow, the second period is further divided into a period designated 2-1 for integrating a measurement current and a period designated 2-2 for making an inverse integration of the reference current. In the 2-1 period, the switch SW3 is open and the switch SW4 is first closed so that the first current source circuit 21″ produces a current $I_{1in}$ proportional to the unknown voltage Vin to be measured, $I_{1in} = KVin$. At this time, the switches SW6 and SW7 are closed and the switch SW5 is open in the integration/comparator circuit 100. The switches SW1 and SW2 are also then open. Accordingly, the current $I_{1in}$ is continuously integrated during the 2-1 period by the integrator 110. During the 2-2 period, the switch SW5 is closed and the switch SW6 is open (the switch SW7 is left closed). Under this condition, the reference current $I_2$, which is opposite in polarity to the current $I_{1in}$, is applied to the integrator 110 where it is inversely integrated from the integration value at the termination of the 2-1 period to the initial value of the beginning of the same period. The output of the integrator 110 is then applied to the comparator (COM) 102. Assuming now that the direction of the 2-1 period is designated by Tc1 of and the 2-2 period by Tc2, then the following relation is obtained.

$$I2(Vref)/Tc1 = I_{1in}(Vin)/Tc2.$$

Therefore, $I_{1in}$ or Vin may be expressed by using Tc2, knowing Tc1 and I2(Vref). Generally, Tc1 and Tc2 are defined by the number of pulses with the equal periods and the number of the pulses defining the Tc2 is made to correspond to the digital quantity to be displayed.

With reference to FIG. 8, another example of the A-D converter using the constant current source according to the invention will be described. The feature of this example is that the A-D conversion is made through the comparison of a measuring current with a reference current or its shunted currents. This example may be realized by replacing the circuit block 200 including the integration/comparison circuit 100 and the current inverting circuit 23' by a circuit block 200' in FIG. 8. The control unit 120' which produces output control signals $D_1$ to $D_4$ is used in place of the unit 120 in FIG. 7.

As shown, the source of a p-channel FET $Q_{20}$ is connected via a resistor R and a connection point 23e to a positive potential $+Vc$ with the gate and the drain coupled together at the terminal 23a of the second current source 22'. The source of another FET $Q_{21}$ is connected to the connection point 23e via a resistor 2R with a resistance value twice that of the resistor R, and with the gate coupled to the gate of the FET $Q_{20}$. The drain of the FET $Q_{21}$ is connected to the terminal 121 of the switch SW8. The source of a FET $Q_{22}$ is connected via a resistor 2R to one end of a resistor R which is connected at its other end to the resistor 2R associated with the FET $Q_{21}$ and to the connection point 23e. The gate of the FET $Q_{22}$ is connected to the gates of the FETs $Q_{20}$ and $Q_{21}$ and the drain of FET $Q_{22}$ is connected to the terminal 122 of a switch SW9. In the same manner as resistor R is inserted between the connection points 23e and 23f, a resistor R is inserted between the connection points 23f and 23g and another resistor R between connection points 23g and 23h. Resistors 2R are similarly provided and which are connected at one end to the connection points 23g and 23h and at the other end to the sources of FETs $Q_{23}$ and $Q_{24}$. A resistor 2R is connected at one end to the connection point 23h and at the other end to the source of a FET $Q_{25}$. The gates of the FETs $Q_{23}$ to $Q_{25}$ are commonly connected to each other and to the terminal 23a which also connects the gates of the FET $Q_{20}$ to $Q_{22}$. The drain of the FET $Q_{23}$ is coupled to the terminal 123 of a switch SW10. The drain of the FET $Q_{24}$ continues to the terminal 124 of a switch SW11. The drain of the FET $Q_{25}$ is directly connected to a bus line 200a.

With such an arrangement, the FET $Q_{21}$ feeds from the drain to the terminal 121 a current equal to ½ the current $I_2$ flowing through the FET $Q_{20}$. Similarly, a current flowing through the FET $Q_{22}$ is ¼ the current $I_2$; a current of the FET $Q_{23}$ ⅛ the current $I_2$; currents of the FET $Q_{24}$ and $Q_{25}$ 1/16 the current $I_2$. The switches SW8 to SW11 are controlled by control signals D1 through D4 to connect the terminals 121 through 124 to the bus line 200a or to a connection line 20c coupled to the switch SW1. The connection line 20c is connected to the output line 30d of the first current source 21'' and to the input of the comparator 102'.

In operation, before the A-D conversion is initiated, switches SW1 to SW3 are closed and switches SW8 to SW11 are all turned to the line 200a and the switch SW12 is turned to the line 20c. Under this condition, the sum of the currents of the FETs $Q_{21}$ to $Q_{25}$, that is to say, the current which should be made to correspond to current $I_2$ of the FET $Q_{20}$, flows through the switch SW12 and the line 30d. This current is the reference current $I_1$ produced by the first current source 21''. Here, a difference current between the currents $I_1$ and $I_2$ is fed through the switch SW1 to the capacitor C1. Through the above-mentioned process, the currents $I_1$ and $I_2$ are made equal. Thus, the current $I_2$ flowing through the FET $Q_{20}$ is made equal to the current $I_1$ so that $I_2/2$ to $I_2/16$ correspond to the FETs $Q_{21}$ to $Q_{24}$, respectively, when, the switches SW1, SW2, SW3 and SW12 are open. While the switches SW8 through SW11 are turned again to the line 200a, the switch SW12 is turned to a line connected to another current absorption source. At this stage, the A-D converter is in a conversion-ready condition. Then, the switch SW4 is closed and the current $I_{1in}$ independence on the potential Vin to be measured, appears on the output line 30d. Under this condition, the switches SW8 through SW11 are selectively actuated to also selectively couple the corresponding associated terminals 121 to 124 to the line 20c by detecting, with the comparator 102 a difference current between the total current of those selected paths and current $I_{1in}$. When the difference current becomes zero, the total current of the selected FETs is equal to the current $I_{1in}$. The control unit 120' responses to this condition, that is the difference current becomes zero, to produce the digital value corresponding to the current sum at the output terminal 115'. At this stage, the A-D converting operation is completed.

The invention is not limited to the embodiments and applications described but permits various other modifications and applications within the scope of the invention.

We claim:

1. A current source circuit comprising first current source means for producing a given current value, second current source means for producing a controlled amount of current, means for detecting a difference between said given current value and the current value flowing through said second current source means, and controlling means responsive to the detected difference for controlling said second current source means to make the amount of the current produced substantially equal to said given current value.

2. The current source circuit according to claim 1, in which said controlling means includes a capacitor means which is charged by said difference current.

3. The current source circuit according to claim 2, in which said controlling means includes a differential amplifier having the non-inverting input terminal supplied with a first given potential and the inverting input terminal supplied with said potential difference.

4. The current source circuit according to claim 3, in which said second current source means includes a first field effect transistor with the gate coupled to the output of said amplifier, one of the source or drain coupled to a first given potential via a resistor, and the other of the drain or source coupled to a current terminal, said difference current detecting means including a second field effect transistor with one of the drain or source coupled to a second given potential and the other of the drain or source coupled to the gate thereof and said current terminal, and a third effect transistor with one of the source or drain coupled to said second given potential, the gate coupled to the gate of said second field effect transistor and the other of the drain or source coupled to said first current source means, wherein the difference current is detected from the drain or source of said third field effect transistor and is selectively fed to the inverting input terminal of said amplifier means connected to one end of the capacitor of which the other end is connected to the drain or source of said first field effect transistor.

5. A current source circuit comprising a first current source means producing a constant value of current, a second current source means for producing a controlled amount of current, a current inverting circuit having a first current terminal coupled to a current output terminal of said first current source means and a second current terminal coupled to a current output terminal of said second current source means, said current inverting circuit producing at said first current terminal substantially the same amount of current as the amount of current produced by said second current source to thereby derive the difference in current between said constant value of current and the controlled amount of current from an intermediate junction of said first current terminal and the current output terminal of said first current source means, and controlling means responsive to said difference for controlling said second current source means so as to make the amount of said controlled current substantially equal to said constant value.

6. The circuit according to claim 5, wherein said controlling means includes an amplifier means having an output coupled to a control terminal of said second current source means, switch means arranged between said first current terminal and an input of said amplifier means and capacitor means arranged between said input of said amplifier means and said second current source means.

7. The circuit according to claim 5, wherein said second current source means includes a transistor having a first terminal coupled to said second current terminal and a resistor arranged between a second terminal of said transistor and a first potential.

8. The circuit according to claim 5, wherein said current inverting circuit includes a first transistor having a first terminal coupled to a second potential, a control terminal and a second terminal commonly coupled to said second current terminal; and a second transistor having a first terminal coupled to said second potential, a control terminal coupled to the control terminal of said first transitor and a second terminal coupled to said second current terminal.

9. A current source circuit comprising a current inverting circuit having a first current terminal and a second current terminal, a first current source arranged between said first current terminal and a first potential, said first current source producing a constant value of current, an amplifier, second current source arranged between said second current terminal and said first potential, said second current source producing a controlled amount of current in response to an output of said amplifier, a series circuit arranged between said first current course and said second current source, said series circuit including a capacitor and switching means, an intermediate junction of said capacitor and switching means coupled to an input of said amplifier.

10. The circuit according to claim 9, wherein said current inverting circuit includes a first bipolar transistor having an emitter coupled to a second potential, a base, and a collector coupled to said first current terminal; and a second bipolar transistor having an emitter coupled to said second potential, a base coupled to the base of said first bipolar transistor and a collector coupled to the base of said second bipolar transistor and to said second current terminal.

11. The circuit according to claim 9, wherein said second current source includes a third bipolar transistor coupled to said second current terminal and a base coupled to the output of said amplifier means; and a resistor arranged between an emitter of said third bipolar transistor and said first potential.

12. The circuit according to claim 9, wherein said current inverting circuit includes a first field effect transistor having a source coupled to a second potential, a gate, and a drain coupled to said first current terminal; and a second field effect transistor having a source coupled to said second potential, a gate coupled to the gate of said first field effect transistor and a drain coupled to said gate of said second field effect transistor and to said second current terminal.

13. The circuit according to claim 12, wherein said second current source includes a third field effect transistor having a source coupled to said second current terminal and a gate coupled to the output of said amplifier; and resistor means coupled between a drain of said third field effect transistor and said first potential.

14. A current source circuit comprising a first field effect transistor having a source supplied with a first potential, a second field effect transistor having a source supplied with said first potential and a gate coupled to the gate of said first field effect transistor and the drain of said second field effect transistor, a first current source means arranged between the drain of said first field effect transistor and a second potential, said first current source means producing a constant value of current; a third field effect transistor having a source coupled to the drain of said second field effect transistor, resistor means arranged between the drain of said third field effect transistor and said second potential, a differential amplifier having an output coupled to the gate of said third field effect transistor and having first and second input terminals, switching means arranged between said first input terminal and the drain of said first field effect transistor, capacitor means arranged between said first input terminal and the drain of said third field effect transistor and means for supplying said second input terminal with a predetermined potential.

15. A circuit comprising a current inverting circuit having a first current terminal and a second current terminal, a first current source producing a constant value of current, a current circuit responsive to an input voltage for producing corresponding value of current, an output of said current circuit being coupled to said first current terminal, a capacitor having a terminal coupled to an input of said current circuit, first switch means for operatively coupling said second current terminal and an ouptput of said current source, second switch means for operatively coupling said terminal of said capacitor and said second current terminal, an analog to digital converter, and third switch means for coupling said second current terminal with an input of said analog to digital converter when said second switch is in non-conductive state.

16. The circuit according to claim 15, wherein said current circuit includes an amplifier having an input coupled to said terminal of said capacitor and a second current source controlled by an output of said amplifier.

17. The circuit according to claim 16, further comprising a comparator circuit for comparing an output of said integrator circuit with a predetermined voltage.

18. An analog to digital converter circuit comprising first means for converting an input voltage to corresponding value of current, current source means for producing a constant value of current, detection means for detecting the difference in value between said corresponding value and said constant value, capacitor means coupled to an input of said first means, feedback means for operatively coupling said capacitor with an output of said detection means to thereby make said corresponding value substantially equal to said constant value, and second means for converting a value of an input current into a digital value, wherein said corresponding value of current after operation of said feedback means is used as a reference current for said second means.

19. The circuit according to claim 18, wherein said second means includes integration means, first switch means for operatively supplying an input of said integration means and second switch means for operatively supplying said corresponding value of current.

20. The current according to claim 18, wherein said second means includes third means for dividing said corresponding value of current into a plurality of weighted values of currents, fourth means for selectively combining said weighted values of currents and means for comparing said input current with said weighted values of current combined by said fourth means.

* * * * *

UNITED STATES PATENT AND TRADEMARK OFFICE
CERTIFICATE OF CORRECTION

PATENT NO. : 4,251,743

DATED : February 17, 1981

INVENTOR(S) : HAREYAMA

It is certified that error appears in the above—identified patent and that said Letters Patent is hereby corrected as shown below:

Column 1, line 8, after "known" insert -- type of -- ;

line 29, after "second" insert -- current -- ;

line 32, after "source" insert -- 2 -- .

Column 2, line 41, after "at" insert -- one of -- ; after "drain or" delete "other of the" ;

line 46, after "coupled" insert -- to -- ;

line 61, delete "via" and insert -- through -- .

Column 4, line 59, after "$\frac{1}{CR}$" insert -- $\int$ -- ;

line 61, delete "$-\frac{t1}{RC}$" and insert -- $-\frac{t_1}{RC}$ -- .

Column 5, line 1, delete "$-\frac{t1}{RC}$" and insert -- $-\frac{t_1}{RC}$ -- ;

line 20, delete "Kω" and insert -- KΩ -- ;

line 58, after "opened" delete the comma.

Column 6, line 11, after "ideally" insert -- are -- ;

line 24, delete "Kω" and insert -- KΩ -- .

UNITED STATES PATENT AND TRADEMARK OFFICE
CERTIFICATE OF CORRECTION

PATENT NO. : 4,251,743

DATED : February 17, 1981

INVENTOR(S) : HAREYAMA

It is certified that error appears in the above—identified patent and that said Letters Patent is hereby corrected as shown below:

Column 7, line 36, after "case" delete ", and";

line 44, delete "m V" and insert -- mV -- .

Column 8, line 19, after "similar" insert -- to -- ;

line 43, after "measured," insert -- that is, -- .

Column 10, line 2, after "when" delete the comma;

line 8, delete "independence" and insert -- in dependence -- ;

line 13, delete "102" and insert -- 102' -- ;

line 17, delete "responses" and insert -- responds -- ;

line 55, after "third" insert -- field -- .

UNITED STATES PATENT AND TRADEMARK OFFICE
CERTIFICATE OF CORRECTION

PATENT NO. : 4,251,743
DATED : February 17, 1981
INVENTOR(S) : HAREYAMA

It is certified that error appears in the above—identified patent and that said Letters Patent is hereby corrected as shown below:

Column 11, line 49, delete "course" and insert -- source -- .

Column 12, line 46, delete "ouptput" and insert -- output -- .

Signed and Sealed this

Eighteenth Day of August 1981

[SEAL]

Attest:

GERALD J. MOSSINGHOFF

Attesting Officer    Commissioner of Patents and Trademarks